(12) United States Patent
Beck et al.

(10) Patent No.: US 11,716,815 B2
(45) Date of Patent: Aug. 1, 2023

(54) LED CHIP INSERT, LIGHTING DEVICE, LIGHTING MODULE, AND METHOD OF MANUFACTURING THE LIGHTING DEVICE

(71) Applicant: OSRAM GmbH, Munich (DE)

(72) Inventors: Michael Beck, Dinkelsbühl (DE); Sebastian Jooss, Dettingen (DE); Gerhard Behr, Altheim (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 17/759,348

(22) PCT Filed: Jan. 20, 2021

(86) PCT No.: PCT/EP2021/051225
§ 371 (c)(1),
(2) Date: Jul. 22, 2022

(87) PCT Pub. No.: WO2021/148484
PCT Pub. Date: Jul. 29, 2021

(65) Prior Publication Data
US 2023/0059982 A1    Feb. 23, 2023

(30) Foreign Application Priority Data

Jan. 24, 2020   (DE) .................. 102020200880.9

(51) Int. Cl.
*H05K 1/00*     (2006.01)
*H05K 1/18*     (2006.01)

(52) U.S. Cl.
CPC ... *H05K 1/184* (2013.01); *H05K 2201/10106* (2013.01)

(58) Field of Classification Search
CPC ................... H05K 1/184; H05K 2201/10106
See application file for complete search history.

(56) References Cited

U.S. PATENT DOCUMENTS

| 4,445,274 A | 5/1984 | Suzuki et al. |
| 4,714,952 A * | 12/1987 | Takekawa ............. H01L 23/498 |
| | | 257/676 |

(Continued)

FOREIGN PATENT DOCUMENTS

| DE | 19610044 A1 | 9/1997 |
| DE | 102015206471 A1 | 10/2016 |

(Continued)

*Primary Examiner* — Pete T Lee
(74) *Attorney, Agent, or Firm* — Slater Matsil, LLP

(57) ABSTRACT

In an embodiment a LED chip insert for a printed circuit board includes a lead frame in which a number of electrically conductive strings with respective ends are formed by punching, the strings having support surfaces which are configured for mounting on the printed circuit board and which form a common plane, wherein the lead frame has a region formed as a recess with respect to the ends, an injection molded frame including an electrically insulating material and annularly surrounding a surface of the lead frame exposed within the region formed as the recess facing the ends of the strings, and thereby effecting an overall trough-like structure; and at least one LED chip which is placed in the region formed as the recess and has a first electrical contact terminal and a second electrical contact terminal, the first electrical contact terminal being electrically conductively connected to a first one of the strings and the second electrical contact terminal being electrically conductively connected to a second one of the strings.

19 Claims, 6 Drawing Sheets

(56) References Cited

U.S. PATENT DOCUMENTS

| | | | | |
|---|---|---|---|---|
| 4,857,988 | A | * | 8/1989 | Fottler .................. H01L 23/13 |
| | | | | 257/E23.189 |
| 6,539,626 | B2 | * | 4/2003 | Kolnaar ................. H01L 23/13 |
| | | | | 264/633 |
| 8,299,716 | B2 | | 10/2012 | Melzner et al. |
| 11,343,893 | B2 | | 5/2022 | Jooss |
| 2019/0063706 | A1 | | 2/2019 | Feil et al. |
| 2019/0110348 | A1 | | 4/2019 | Feil et al. |
| 2019/0306939 | A1 | | 10/2019 | Jooss |
| 2019/0333850 | A1 | | 10/2019 | Lin et al. |

FOREIGN PATENT DOCUMENTS

| | | |
|---|---|---|
| DE | 102018201228 A1 | 1/2019 |
| DE | 102017214659 A1 | 2/2019 |
| DE | 102017217883 A1 | 4/2019 |
| DE | 102017222649 A1 | 6/2019 |
| DE | 102018202464 A1 | 8/2019 |
| EP | 2185856 A2 | 5/2010 |
| FR | 2876965 A1 | 4/2006 |
| WO | 2009033922 A2 | 3/2009 |

\* cited by examiner

LED CHIP INSERT, LIGHTING DEVICE, LIGHTING MODULE, AND METHOD OF MANUFACTURING THE LIGHTING DEVICE

CROSS-REFERENCE TO RELATED APPLICATIONS

The present application is a national stage entry according to 35 U.S.C. § 371 of PCT Application No. PCT/EP2021/051225 filed on Jan. 20, 2021, and which claims priority to German Patent Application Serial No. 10 2020 200 880.9 filed on Jan. 24, 2020 which is incorporated herein by reference in its entirety and for all purposes.

TECHNICAL FIELD

The present invention relates to an LED chip insert for a printed circuit board, a lighting device with an LED chip insert and a printed circuit board, a lighting module using the lighting device, which in particular can also be used in vehicle lamps or headlights, and a method for manufacturing the lighting device.

BACKGROUND

In prior art, vehicle lamps and headlights are known in which LED modules are being used to a strongly increasing extent. Depending on the specific application, high-power LEDs are used here a well. A recently introduced platform that may also comply with the standardizations envisaged by the International Technical Commission (IEC) is the eXchangeable LED Signal lamp, or XLS for short. This standard allows uniform designs with possible variation of lighting devices, i.e., different combinations and arrangements of LEDs in the module depending on use and application. Such different applications may be, for example, daytime running lights, turn signals, brake lights or additional functions such as fog lights, high beams, etc.

A particularly relevant issue regarding the use of high-power LEDs in such LED modules concerns thermal management. Conventionally, the LEDs are mounted on printed circuit boards (PCBs) directly, or by means of lead frames. Under the circumstances, the PCBs are essentially made of flame-retardant FR-4, which itself does not provide sufficient heat conduction. In order to dissipate the heat efficiently, holes, so-called vias, may be provided in the circuit board, which are coated from the inside, e.g., with copper, and are connected to the LED chip containing the individual or multiple LEDs via surface copper tracks. By virtue of such vias, heat can be transported to the back surface of the PCB, where it is connected to a heat sink via an adhesive layer in the case of XLS modules. However, due to design and thermal stress, it has proven unfavorable to place LED chips directly on the vias. In special cases, this may result in individual LED chips being skewed, so that the emitted light in the headlight may not be emitted in accordance with the standards.

Alternatively, very thin printed circuit boards or PCBs with microvias (μ-vias) may be used, but such a structure has proven to be partly unstable and therefore unreliable. Furthermore, metal core PCBs or thermally conductive ceramics have been and are still being used. However, such solutions are extremely complex and therefore too expensive in the volume market of replaceable light modules which are considered here.

SUMMARY

Embodiments provide a lighting device or components thereof, a lighting module using the lighting device, and a corresponding method of manufacturing the lighting device, which improves heat dissipation and/or reduces costs associated with thermal management in lighting modules.

At the core of one embodiment of the invention is an LED chip insert for a printed circuit board. This comprises a lead frame, a molding frame and at least one LED chip provided in the insert.

In the lead frame, a number of electrically conductive strings with respective ends are formed by punching, which have support surfaces that are intended for attachment to a printed circuit board and that build up a mutually common plane. The support surfaces may at least partially form contact surfaces. The ends may be formed in a tab-like manner. However, the support surfaces do not need to entirely come to rest over the surface of the printed circuit board when the LED chip insert is attached thereto.

The strings are formed or structured by punching out, i.e., by removing material from the lead frame blank. They can therefore be (electrically) separated from each other according to the embodiments described hereafter. However, it is equally possible that they are wholly or partially interconnected. It is also possible that there are only two ends in total, which form support surfaces on opposite sides of the lead frame, for example. The support surfaces may, but in individual cases need not, form electrical connections of the lead frame for supplying the LED chip with electrical power. If they form electrical connections, they are preferably soldered to the printed circuit board, preferably with conductor strings made of copper, for example, which are formed on the printed circuit board. The strings are designed according to the desired number, arrangement and function of the LED chips and have corresponding electrical properties. Not every string has to be occupied by an LED chip. Preferably, at least two strings are required.

The lead frame also has a region formed as a recess with respect to the respective ends. The term "recess" already indicates here that material of the lead frame is formed or displaced out of the reference plane of the ends or their supporting surface, namely in a direction in which the supporting surface of the ends of the strings is facing, in the case of mounting the LED chip insert on a printed circuit board consequently towards and into the printed circuit board plane.

Further, the LED chip insert has an injection-molded frame formed of an electrically insulating material that annularly surrounds a surface of the lead frame exposed within the region of the recess facing the ends of the strings (i.e., the support surfaces) and consequently provides an overall trough-like structure. The injection molded frame may be manufactured by injection molding methods known in the technical field. Preferably, it encapsulates the structural design of the lead frame and thus forms the trough, which can be used with particular advantage, for example, for filling with a reflective layer comprising titanium oxide around the LED chip, so that a saving of efforts occurs here alone. Conventionally, an additional step is required to form a wall around the LED chip(s), which is then filled. The injection-molded frame also has the particular advantage that it mechanically connects the components of the lead frame, i.e., the strings, to one another, while simultaneously mutually electrically insulating them and giving the entire insert mechanical cohesion.

Furthermore, at least one LED chip (preferably several LED chips) is provided, which is placed in the region of the lead frame formed as a recess on one or more of the strings and has a first electrical contact terminal and a second electrical contact terminal, the first electrical contact terminal being electrically conductively connected to a first of the strings and the second electrical contact terminal being electrically conductively connected to a second of the strings. Consequently, in the assembled state, the strings supply the LED chip with the electrical (voltage or current) signals required for operation.

Due to the structure according to embodiments of the invention, the at least one LED chip is connected directly or at least via an adhesive to the lead frame in the region of the recess. It may dissipate heat directly via the string or strings concerned. Since the recess is oriented in the direction of the supporting surface, the respective lead frame assembly or the string in the region of the recess extends through the printed circuit board in which the LED chip insert is to be inserted—which is of course only possible if the latter provides a corresponding recess, as an embodiment of the invention to be described below with regard to a lighting device with a printed circuit board and a LED chip insert.

Since the region of the recess extends through the PCB plane, the thermally conductive lead frame assembly may also contact an underlying heat sink surface, as is provided in particular in the case of XLS modules (but also in other light modules), and to which, for example, the PCB is bonded in the vicinity of the recess. In other words, by means of the LED chip insert according to embodiments of the invention, the heat from the LED chip may be dissipated with high efficiency via the string in the region of the recess directly to any cooling surface in the lighting module that may be located underneath. Preferably, the contact surface, i.e., the back surface of the lead frame and of the injection-molded frame, which for example fills up the space between the strings of the lead frame in the region of the recess, is bonded to the cooling surface in the light module.

In this way, it is possible to perform effective thermal management using embodiments of the invention without the use of costly components such as metal core PCBs (MCPCB) or additional copper wire lines, and at the same time even, as described, eliminates the process of dispensing a dam to provide a trough for filling with a silicone potting compound containing titanium oxide and having reflective properties for the blue primary radiation.

In the prior art (see, for example, DE10 2017 213 269 A1), a surrounding structure (wall, dam) made of silicone is formed around the conversion light sources (LEDs), which is raised relative to the base surface. The dam is applied by dispensing. The space encompassed by this dam, including the interspaces existing between the individual copper strings, is filled with a light-reflecting, $TiO_2$-containing silicone potting compound, to such an extent that the (blue) primary radiation emerging laterally from the phosphor converter of the LEDs is reflected back to the LED or onto the conversion layer of the LEDs and is thus available again for conversion of blue radiation into yellow conversion light. By providing a trough, the formation of an external dam is no longer necessary, since the outer boundary of the trough fulfills the function of a wall.

This also simplifies the formation of this titanium oxide reflective layer.

Embodiments of the invention enables a spatially very short, direct conduction of heat through pure copper up to the heat sink of the light module.

According to an advantageous embodiment, the region of the lead frame formed as a recess is formed by punching deformation (i.e., stamping or press-braking) of an originally planar lead frame blank which has been further punched out in advance to form the strings. Such a process is particularly simple and thus inexpensive, and at the same time permits a degree of indentation that can be precisely adjusted.

According to another advantageous embodiment, the injection molding frame molds a section of the lead frame adjoining the ends of the strings and extending into the recess, respectively between and around the strings. In this way, it effects the ring-like enclosure around the exposed (front) surface of the lead frame within the recess. Preferably, the portion of the lead frame extending and leading into the recess is substantially perpendicular to the plane of the support surfaces to save space. If the strings are parallel to each other and form ends on only two opposite sides with support surfaces for attachment to the (front) upper main surface of the printed circuit board, it may be that there are no ends on the end faces of the lead frame and the section of the recess is open in directions perpendicular to the string direction (within the board plane). Then, preferably, this section is also covered by the injection molded frame so that the trough is formed, i.e., the open end(s) of the recess are closed by the injection molded frame so that the trough shape is advantageously retained and the dam required to form a reflective layer can be dispensed with.

As already mentioned, according to a further, correspondingly advantageous embodiment, the trough-like structure inside the injection-molded frame enclosing the recess like a ring is filled with a preferably titanium oxide-containing silicone potting compound, the upper surface of the layer being at the same level as or below an upper light-emitting surface (conversion layer) of the LED chip, so that the latter is not wetted by the layer. In this way, the light emitted by the LED(s) in the actual direction of emission is not affected. However, the blue light component emerging laterally and therefore hardly usable due to the geometry may be at least partially reflected back in the reflection layer, or onto the conversion layer of the LEDs, respectively, and is, if necessary, converted into yellow light and emitted from there in the desired direction, of light emission so that efficiency is further increased.

The lateral surfaces of the trough in the region of the injection molding frame may be additionally coated to improve reflection. For this purpose, they may also have an inclination relative to the surface normal, i.e., need not be perpendicular to the supporting surface. The injection molded frame can be designed in such a way that only a minimum necessary region around the LEDs remains free for the reflective layer and the electrical contacting of the individual copper strings. Thus, the necessary volume for the reflective layer can be reduced.

According to a further advantageous embodiment, the region of the lead frame formed as a recess extends essentially along a plane parallel to the supporting surface. This increases the contact area with an underlying cooling surface of a heat sink and improves heat conduction.

According to a further advantageous embodiment, the lead frame has a flat rear surface in the region of the recess, facing away from the ends of the strings. In this case, the rear surface is substantially flush with the lower main surface of the printed circuit board. As a result, the circuit board in question can be bonded to the heat sink or its flat heat sink surface with a flat rear surface including the LED chip insert being inserted therein. The contact area is thus further increased and heat conduction is improved.

Preferably, there is a tolerance of up to 20 µm, preferably up to 5 µm with regard to a difference in a direction perpendicular to the bottom main surface. Such difference may be easily compensated for by an adhesive between the cooling surface and the back of the circuit board. It is important that the connection between the ends of the lead frame and the solder pads on the PCB (if soldering is used, for example) is not under mechanical stress. This could be the case if the region of the lead frame containing the recess protrudes beyond the back surface of the PCB when these parts are assembled and the PCB is glued to the cooling surface. Therefore, taking into account manufacturing tolerances, in practice the recess tends to be restrained by a slight margin compared to the PCB thickness.

According to another advantageous embodiment, the lead frame is formed of copper, preferably having a thickness of 100 μm to 150 μm, and further preferably coated with a protective film against oxidation forming an end surface, in particular a film of ENEPIG (Electroless Nickel Electroless Pallladium Immersion Gold). This protective layer is extremely planar and has very good oxidation properties. It is also particularly suitable for gold wire bonding, which is used with reasonable advantages in LEDs.

According to another advantageous embodiment, the injection molded frame on the lead frame is formed from a plastic, in particular a thermoplastic such as a polyphtalamide (PPA) or polycyclohexylene dimethylene terephthalate (PCT), or formed from WEMC (White Epoxy Molding Compound).

According to a further advantageous embodiment, the at least one LED chip is placed on a first one of the strings in the region of the recess and is bonded to this first string with its base surface forming the first electrical contact terminal, preferably by means of a bonding agent. Starting from the second electrical contact terminal, the at least one LED chip is bonded to a second of the strings via a bond wire. This attachment, carried out in chip-on-board (COB) technology, proves to be particularly suitable for the application. However, the LED chip can also be mounted in SMD technology according to embodiments of the invention.

According to embodiments of the invention, as described above there is further provided a lighting device having the printed circuit board and the LED chip insert therein. The printed circuit board is formed of an electrically insulating material and has an upper main surface with conductor lines (e.g., of copper) and a bottom main surface opposite thereto. A recess is formed extending through the printed circuit board between the main surfaces, as exemplified above. An LED chip insert set up in accordance with one of the embodiments set forth above is provided, i.e., inserted, therein.

The lead frame is attached to the printed circuit board in that the ends of the strings of the lead frame forming the support surface rest with this support surface on an upper main surface of the printed circuit board and are attached thereto, e.g. by soldering, such as reflow soldering, or by laser, which offers advantages yet to be described. The region of the lead frame formed as a recess vis-a-vis the plane is now fitted into the recess in the printed circuit board. It should be noted that at least one tolerance distance is provided between the side walls of the recess, i.e., the injection molded frame, and the inner edge of the recess in the printed circuit board. Contact between the two is not ruled out, but it is also not required. Rather, the geometry—in plan view onto the plane of the PCB or the contact surfaces of the PCB frame—of the recess may well deviate considerably from that of the region of the recess in the PCB frame or in the LED chip insert. The term "fitting" should therefore be interpreted broadly and refers rather to a mere "insertion".

The advantages of this lighting device result from the previous description.

According to another advantageous embodiment, the printed circuit board is formed of a hardly thermally conducting material, preferably FR4. Additionally or alternatively, the PCB may be cut in a substantially circular shape. In the latter case, it is particularly suitable for the replaceable XLS modules whose housings are hollow-cylindrical and in which correspondingly circular printed circuit boards are provided on the end faces, on which the LED chips are directly or indirectly mounted.

According to another advantageous embodiment, a plurality of LED chips are provided, one LED chip each being placed on one of the strings in the region of the recess and being connected via its contact terminals to one and another string on which an adjacent LED chip is placed in the same manner, so that at least a subset of the LED chips are electrically connected in series with one another.

According to another advantageous embodiment, the strings are arranged parallel to each other in the lead frame and the LED chips are arranged in a row along a line or at alternately offset positions on the upper surfaces of the strings. Alternatively or additionally, the LED chips are arranged in two rows parallel to each other on the upper surfaces of the strings.

An LED or part of the LEDs or all LEDs may have an area of about 1 mm$^2$, for example. An area of 2 mm$^2$ is also conceivable. Other geometries are also conceivable. For example, the LEDs are UX3 chips from Osram. The LED may be in the form of at least one individually packaged LED or in the form of at least one LED chip comprising one or more light-emitting diodes. The LED may be in the form of a micro-LED.

The arrangement of the LEDs or part of the LEDs can be matrix-shaped or line-shaped or round. Other designs are also conceivable.

According to embodiments of the invention, a light module is also provided, preferably for use in a light in a motor vehicle (in a vehicle lamp), comprising the lighting device described above, wherein the light module is preferably interchangeable and designed as an eXchangeable LED Signal lamp (XLS). Such a lighting module may have a housing with mechanical locking elements, a heat sink with cooling fins, an electrical connection element, the lighting device with printed circuit board and LED chip insert according to embodiments of the invention, and optionally a sealing ring as main components. The heat sink may have a cooling surface on the front side perpendicular to the axis of the cylindrical housing, on which the printed circuit board is bonded to dissipate heat and supply it to the cooling fins. Together with the circuit board, the recessed region of the lead frame of the LED chip insert also contacts this cooling surface (possibly via an adhesive or bonding agent), so that heat is also dissipated from the LED chip here with high efficiency.

According to another embodiment of the invention, there is also provided a method of manufacturing a lighting device as described above. The method may comprise the steps of:

providing a printed circuit board formed of an electrically insulating material and having an upper main surface with conductive lines and a bottom main surface opposite thereto, and wherein a recess is formed extending through the printed circuit board between the main surfaces;

punching out a lead frame with a number of electrically conductive strings with respective ends;

sheet forming of the lead frame to form a plane jointly forming a support surface through the ends of the strings, as well as a region formed as a recess vis-a-vis the plane;

fitting the region of the lead frame forming the recess vis-a-vis the plane into the recess of the printed circuit board and fixing the ends of the strings forming the support surface to the printed circuit board;

placing the at least one LED chip on one of the strings in the region of the recess and bonding it with its base surface forming a first electrical contact preferably by means of an adhesive to the string, bonding the at least one LED chip to another one of the strings starting from a connection point forming a second electrical contact via a bond wire.

The same or similar advantages as described above result.

According to further advantageous embodiments, further steps may be provided, for example, forming an injection molded frame of an electrically insulating material on the lead frame such that the injection molded frame annularly surrounds an upper surface of the lead frame exposed within the region of the recess to affect a trough-like structure with the at least one LED chip therein.

Furthermore, filling of the trough-like structure within the ring-like enclosing injection molded frame with the exposed upper surface of the lead frame therein and the at least one LED chip thereon with a reflective layer preferably comprising titanium oxide may be provided, wherein the upper surface of the layer is at the same level as or below an upper light-emitting surface of the LED chip so that the latter is not wetted by the layer. Here, too, the advantages described above result.

Further advantages, features and details of the invention will be apparent from the claims, the following description of preferred embodiments and from the drawings. In the figures, the same reference signs denote the same features and functions.

BRIEF DESCRIPTION OF THE DRAWINGS

There is shown in.

DETAILED DESCRIPTION OF ILLUSTRATIVE EMBODIMENTS

Figure 1:
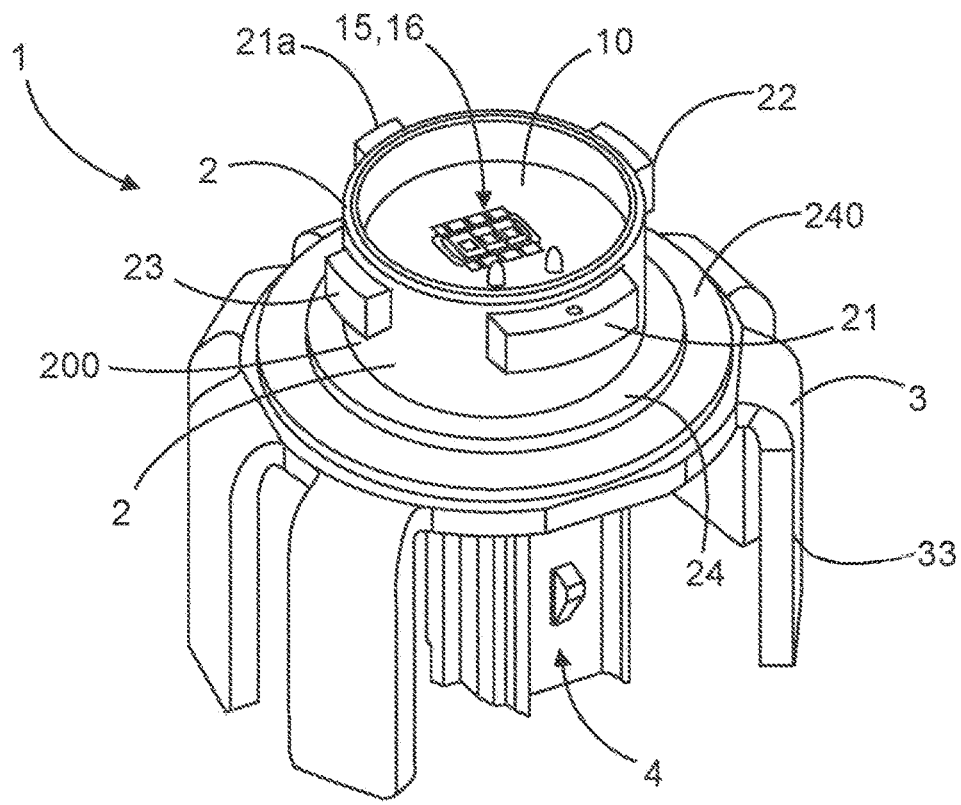
FIG. 1 a perspective view of a lighting module according to an embodiment of the invention, wherein electronics arranged on the printed circuit board as well as optional optics are omitted and conductor lines are not shown.
Figure 2:
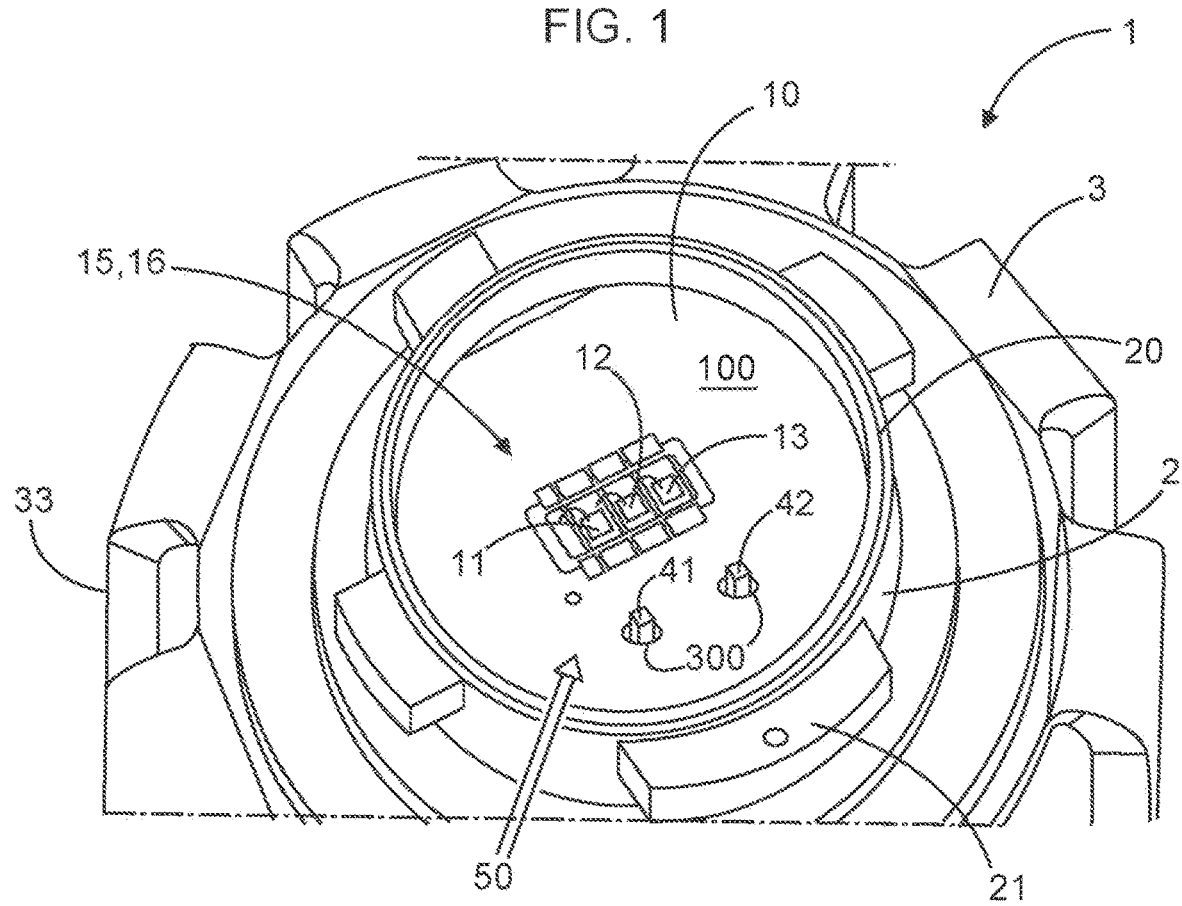
FIG. 2 an enlarged sectional view of the lighting module in FIG. 1.
Figure 3:
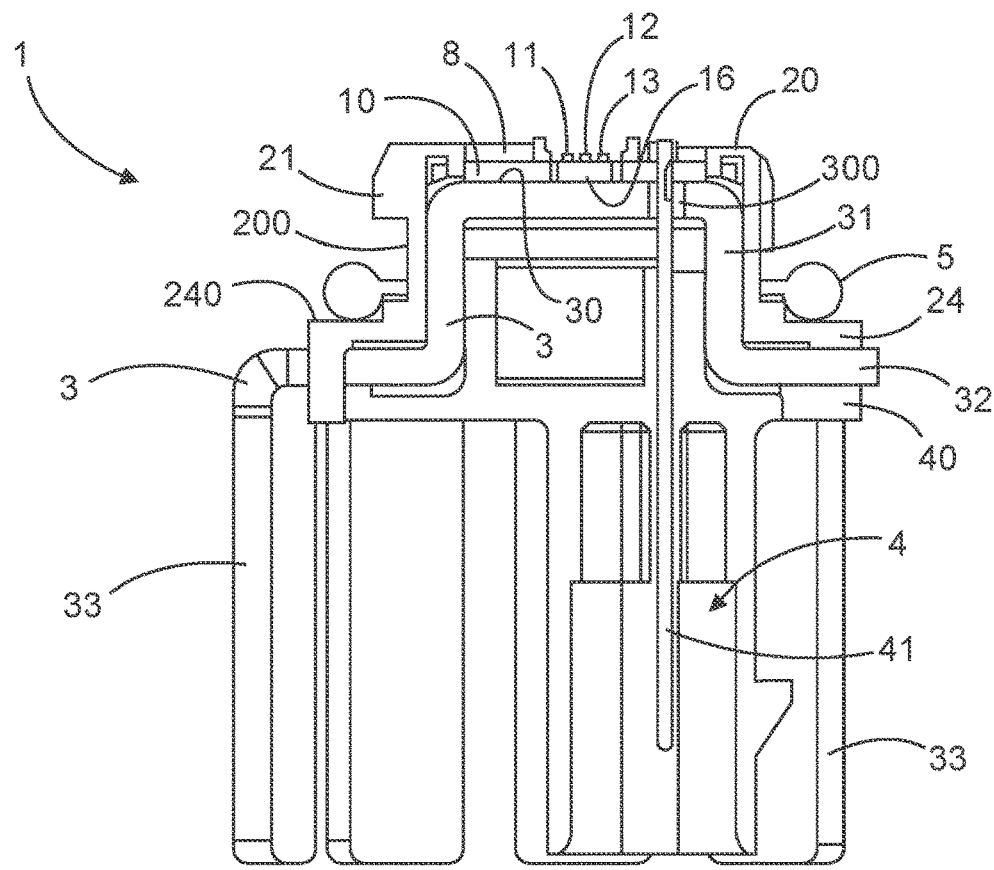
FIG. 3 schematic representation of a longitudinal section through the lighting module shown in FIG. 1.

FIGS. 1 to 3 show an overview of a lighting module according to an embodiment of the present invention. The illustrated light module corresponds to and satisfies the specifications of the XLS platform (exchangeable LED signal lamp). Examples of such light modules—but not yet implementing the invention described herein—can also be found in the following documents:

US 2019063706 A1, DE 102017214659 A1,
US 2019110348 A1, DE 102017217883 A1, DE 102017222649 A1,
DE 102018202464 A1, US 2019306939 A1, DE 102018201228 A1,
DE 102017213269 A1, DE 102015206471 A1.

It should be noted that the application of the lighting device according to the invention to the XLS light modules described by the above documents in each case also represent particularly advantageous embodiments, e.g., the combination of the LED chip insert provided in a recess of the printed circuit board according to the invention with the optics and the LED arrangement according to FIGS. 4 to 7 in DE 10 2015 206 471 A1, with the electrical contacts provided in the bayonet catch of the housing according to FIG. 3 of DE 10 2017 214 659 A1, with the LED arrangements shown in DE 10 2017 217 883 A1 in FIGS. 2 to 11, or with the circuit arrangements shown in DE 10 2018 201 228 A1 in FIGS. 1 to 4, to name just a few examples.

The lighting module according to the first embodiment of the invention has three LED chips 11, 12, 13 (with, for example, one light emitting diode each) arranged on a printed circuit board 10, a housing 2, a heat sink 3 for cooling the semiconductor light sources and electronics 8 for operating the LED chips 11, 12, 13, as well as an electrical connection element 4 for supplying power to the LED chips 11, 12, 13. An optical system and/or a light guide placed on the LED chips is not shown, but may be provided.

The LED chips 11, 12, 13 include three light emitting diodes which are arranged on the printed circuit board 10 together with the electronics 8 for operating the light emitting diodes. The printed circuit board 10 (including the lead frame insert 16 to be described below) serves as a common support for the LED chips 11, 12, 13 and the electronics 8. The LED chips 11, 12, 13 are mounted on the lead frame insert 16 and the electronics 8 are mounted on a surface 100 of the printed circuit board 10 itself, wherein the lead frame insert 16 and the LED chips 11, 12, 13 mounted therein on strings and the electronics 8 being electrically interconnected by conductive lines preferably of copper set up on the printed circuit board. The electronics 8 (shown only in FIG. 3) may be designed, for example, as a driver circuit, in particular as a so-called linear driver, that is, as a linear voltage regulator.

However, a pure resistor circuit is also possible. In addition to pure operation of the LED chips, the driver may also implement various protective functions, e.g., reverse polarity protection, ESD and protection against positive, negative voltage pulses from the vehicle electrical system. The driver may also implement electronic derating, dimming and shutdown of individual chips if required.

The LED chips 11, 12, 13 may be covered by an optical lens (not shown). In the case of an optical lens, liquid silicone may be applied to the surface 100 of the circuit board 10 using a dispenser so that the LED chips are embedded in the silicone compound. After cooling, the silicone compound then forms the optical lens. Other optics are equally possible.

The housing 2 is ring-shaped and formed as a plastic injection molded part. The housing 2 has a first end face with a planar annular disc-shaped end face 20. Along the outer circumference of the annular disc-shaped end face 20, four locking elements 21, 21a, 22, 23 are arranged which project radially from the outer circumferential surface of the annular housing 2 and form a bayonet lock with correspondingly shaped counterparts of a socket of the vehicle lamp. The undersides of the four locking elements 21, 21a, 22, 23 define a plane which serves as a reference plane for the alignment of the LED chips 11, 12, 13 with respect to the housing 2 and with respect to an optical axis of the socket of the vehicle lamp into which the light module is inserted. To activate the bayonet lock, the light module is inserted into the socket of the vehicle light and then rotated clockwise about the ring axis of the housing 2. A locking element 23 may have a stop (not shown) for limiting the aforementioned rotational movement, which stop rests in the socket or mounting opening of the vehicle light after the bayonet is locked. The bayonet lock may be implemented with a product-specific key, so that each type of lighting module has its own key and thus accidental interchanges are avoided. A sealing ring 5 (shown only in FIG. 3) provides the necessary contact pressure of the lighting device to the socket.

At its second end face opposite the first end face, the annular housing 2 has an annular disc-shaped flange portion 24 which projects radially outwardly from the outer peripheral surface of the annular housing 2, forms a bearing surface 240 for a sealing ring 5 and, together with the locking elements 21, 21a, 22, 23, forms an annular groove 200 for receiving the sealing ring 5 made of silicone or rubber.

The heat sink 3 has a hollow-cylindrical shaped heat sink section 31, which is arranged in the inner annular opening of the housing 2 and on its side facing the end face 20 of the housing 2 forms a flat support surface, i.e., a cooling surface 30 for the printed circuit board 10 and in particular for the lead frame insert 16. The cylinder axis of the hollow-cylindrical shaped heat sink section 31 is identical to the ring axis of the annular housing 2. The cooling surface 30 is arranged perpendicular to the cylinder axis of the hollow-cylindrical shaped heat sink section 31 and is bonded to the circuit board 10 and the lead frame insert 16 is inserted therein with electrically insulating, thermally conductive adhesive. The cooling surface 30 of the hollow cylindrical shaped heat sink section 31 has apertures 300 through which three electrical contact pins 41, 42 of the electrical connection element 4 are passed. The electrical contact pins 41, 42 may form a press-fit with the printed circuit board 10.

The heat sink 3 also has a second annular disc-shaped heat sink portion 32 formed on the hollow cylindrical shaped heat sink portion 31, the ring axis of which coincides with the cylindrical axis of the hollow cylindrical shaped heat sink portion 31. The second annular disc-shaped heat sink section 32 is arranged between the annular disc-shaped flange section 24 of the housing 2 and a circular disc-shaped flange section 40 of the electrical connection element 4, and is connected to both by means of an adhesive. Alternatively, it is also possible to completely overmold the heat sink with plastic, so that there is only a single plastic part surrounding the heat sink.

Cooling fins 33 arranged along the circumference of the second heat sink section 32, which is in the form of an annular disc, are integrally formed. The cooling fins 33 are each angled from the second, annular-disc-shaped heat sink section 32 by an angle of 90 degrees (downward in the figures) and each extend parallel to the ring axis of the second, annular-disc-shaped heat sink section 32. The heat sink 3 is made of metal, for example stainless steel sheet or aluminum, and is formed in one piece, for example as a deep-drawn bent part.

The electrical connection element 4 is formed as a plastic injection-molded part and has electrical contact pins 41, 42, each of which is made of metal and is embedded in the plastic material of the electrical connection element 4. The electrical connection element 4 has a circular disc-shaped flange section 40, which rests against the second heat sink section 32, which is annular disc-shaped, on its side facing away from the housing 2. The flange section 40 of the electrical connection element 4 is bonded to the second, annular disc-shaped heat sink section 32 by adhesive. In addition, the adhesive also serves as a sealing means between the flange section 40 of the electrical connection element 4 and the second, annularly formed heat sink section 32 and between the annularly disc-shaped flange section 24 of the housing 2 and the second, annularly disc-shaped heat sink section 32. For this purpose, the adhesive 6 is applied annularly on both sides of the second, annularly disc-shaped heat sink section 32. Alternatively, the adhesive can also be applied at the level of the cooling surface 30 and ensure the sealing functions with the housing 2 there, at a small distance from the printed circuit board 10.

The electrical connection element 4 also has a section formed as a bushing 44, which extends parallel to the ring axis of the housing 2 and is arranged offset parallel to this ring axis and is integrally formed on the circular disc-shaped flange section 40. The free ends of the electrical contact pins 41, 42 each extend into the socket 44 where they serve as electrical contacts of the light module and are provided for connecting a plug which can be plugged onto the socket 44. Once the socket and plug are mated, this connection is tight-sealing. The other ends of the electrical contact pins 41, 42 each extend through the aperture 300 in the cooling surface 30 of the heat sink 3 and may form a press-fit connection with the printed circuit board 10 and are each connected to an electrical contact on the printed circuit board 10. The electrical contact pins 41, 42 are used to supply power to the LED chips 11, 12, 13 on the lead frame insert 16. The lead frame insert 15 together with the LED chips 11, 12, 13 and any layers formed thereon form an LED chip insert 15 according to an embodiment of the present invention.

The light emitting diodes of the LED chips 11, 12, 13 emit, for example, yellow light, red light or white light, or combinations thereof, during operation. The number of LED chips is also not limited to three, nor does the arrangement have to be in a row, but may also be star-shaped or square-shaped or circular or the like.

The light-emitting diodes of the LED chips 11, 12, 13 have a light-emitting surface with a side length of, for example, in the range of 0.4 mm to 0.6 mm. Alternatively, light emitting diode chips having a light emitting surface with a side length in the range of 0.7 mm to 0.8 mm or 0.9 mm to 1.1 mm may be used. The invention and the embodiments are not limited to specific types and combinations of LEDs.

Figure 4:
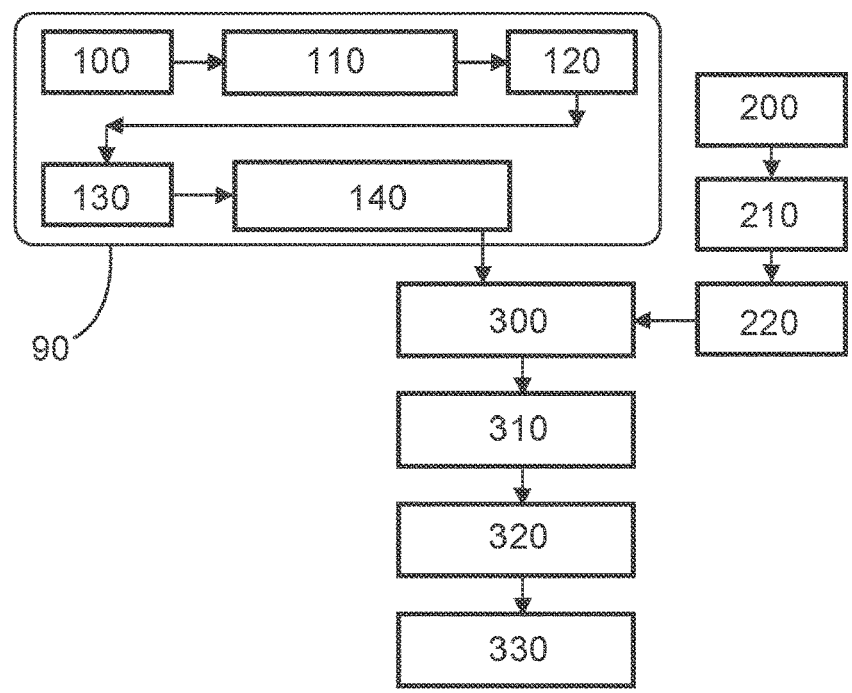
FIG. 4 a flow chart of a method of manufacturing a lighting device according to an embodiment of the invention.

FIG. 4 shows in a flow chart a schematic sequence of a process according to the invention for manufacturing a lighting device 50, which is to comprise the printed circuit board 10 and the LED chip insert 15. The process steps 100 to 140 covered by block 90 here initially relate to the manufacture of the lead frame insert 16 (still without LED chips 11, 12, 13), while the process steps 200 to 220 initially relate only to the printed circuit board 10 and can be carried out in parallel. Only in process step 300 both parts—PCB 10 and lead frame insert 16—are brought together.

Figure 5:
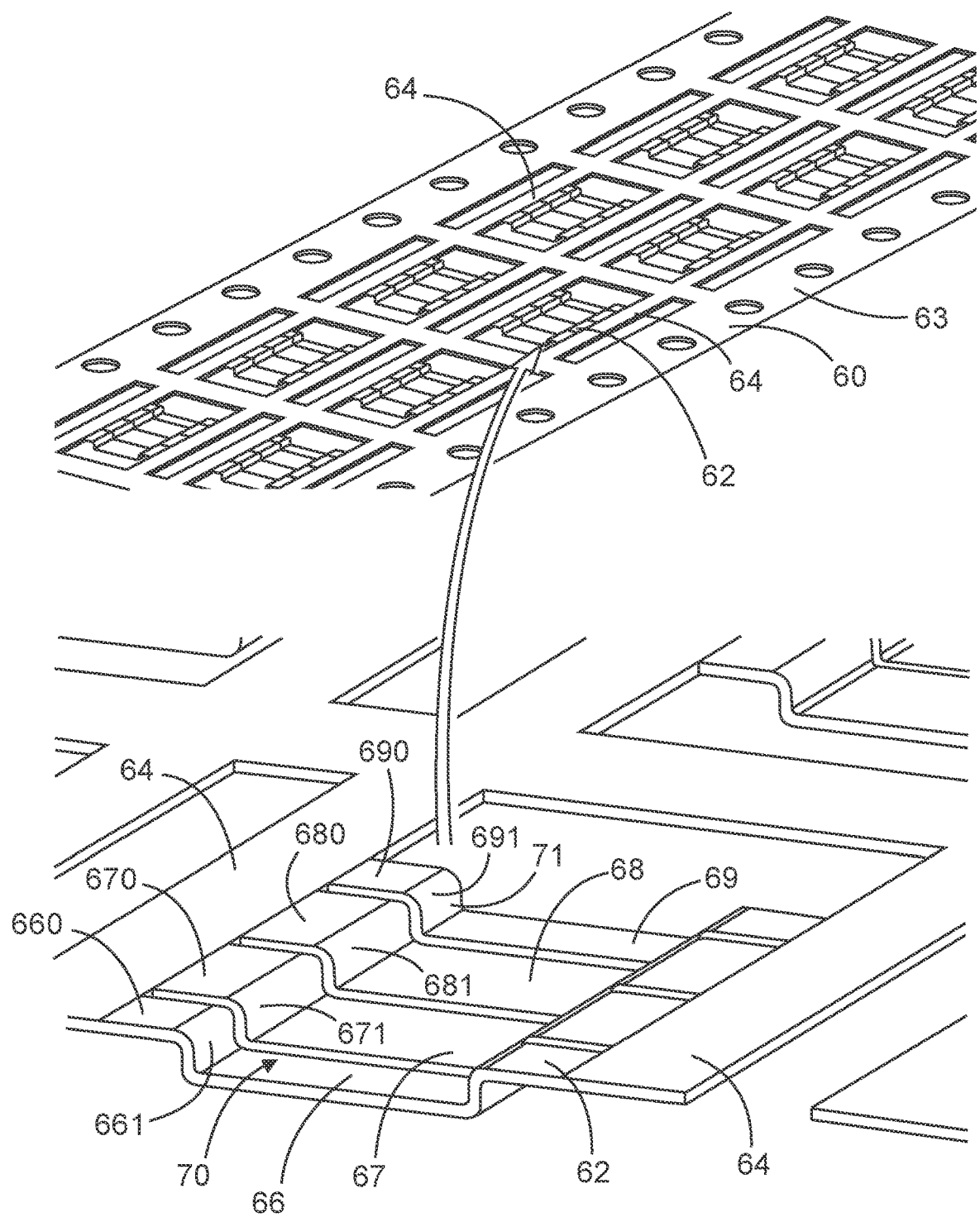
FIG. 5 a perspective view of a lead frame blank punched according to the process sequence shown in FIG. 4.

In a first process step 100 for manufacturing the lead frame insert 16, a lead frame blank 60—as shown in the top of FIG. 5—is first provided and punched. The blank is made of copper (C194) having a thickness of 100 μm to 150 μm, and in the first process step 100 the desired structure for a plurality of lead frames 62 is formed by punching out copper material. The thus punched lead frame blank 60 thereafter has an outer frame 63 supporting all lead frames 62 with an inner frame 64 holding the lead frame 62 together. In the particular embodiment, the lead frame 62 comprises four parallel strings held together only by inner frames 64, as can be seen in the bottom of FIG. 5, where only a section is shown. Three strings 66, 67, 68 have the same width and length, while the fourth string 69 has a smaller width than the other strings, but the same length.

In a further process step 110, a second punching operation is carried out, this now being a stamping or embossing operation in which a recess 71 is formed via deformation in an inner region 70 of the lead frame 62 to be produced. The strings 66-69 are thereby each pressed or displaced out of the lead frame plane in a central region, while their ends 660, 670, 680, 690, which are still attached to the inner frame 64, remain untouched. The amount of the executed displacement by punching deformation is approximately equal to the thickness of the printed circuit board 10 of FR-4 material provided in step 200.

In the next process step 120, the punched lead frame 62 (or still the punched blank with frames 63 and 64) is coated with an anti-oxidation layer, in particular an ENEPIG layer (Electroless Nickel Electroless Palladium Immersion Gold), if necessary also only selectively. Such layer is extremely planar and has very good oxidation properties, and is suitable for soldering applications and aluminum or gold wire bonding. Other anti-oxidation coatings are also possible.

Thereafter, the lead frame blanks 60 are injection molded in process step 130, e.g., with PPA. This material has a high tensile strength and stiffness, a high heat resistance, furthermore a high melting point and a high glass transition temperature, and provides a high creep resistance. Other materials such as PCT or WEMC are also possible.

Figure 6:
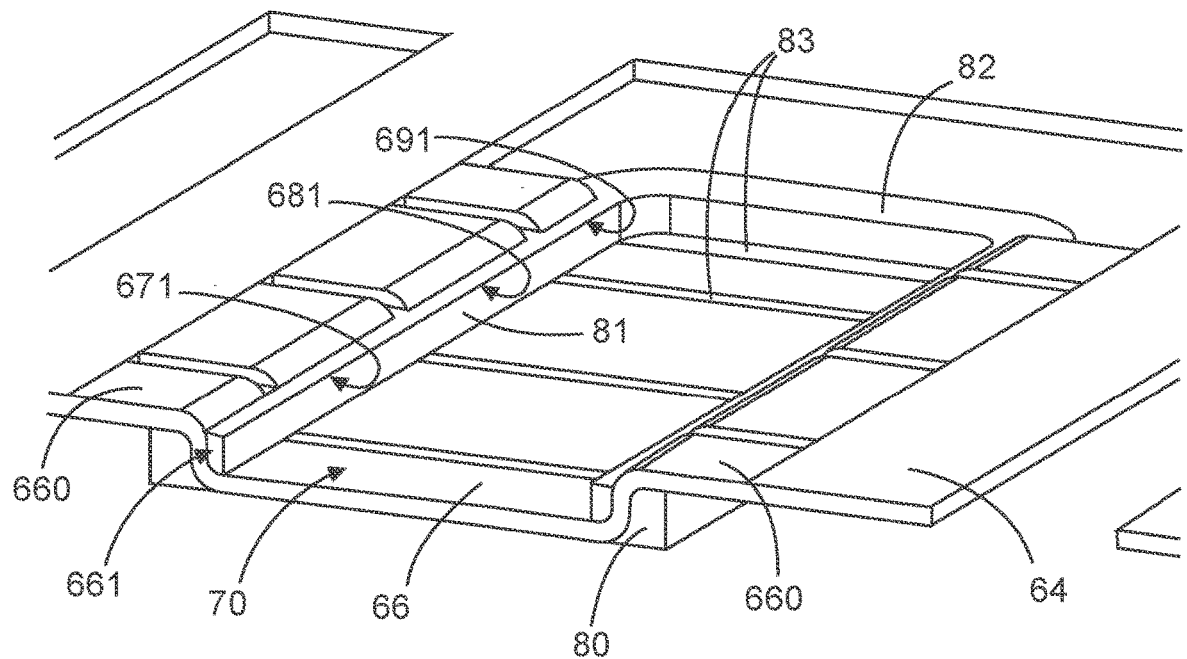
FIG. 6 a perspective view of a lead frame blank provided with injection molding frames according to the process sequence in FIG. 4.

The resulting mold is shown in FIG. 6. The injection molded frame 80 produced in this process step 130 has a wall 81 which annularly encloses the recessed region 70 and is formed with greater thickness at the sections 661, 671, 681, 691 of the strings 66-69 which extend down into the recess 71, adjoin the ends 670-690 of the strings which have remained untouched by the stamping operation, and are inclined to the plane of the printed circuit board. Greater thickness here means that these string sections are completely potted, i.e., not only the interstices are potted but also the front and rear sides of the string sections 661, 671, 681, 691.

In contrast, only the space 83 between the strings 66 to 69 is potted in the bottom of the recess; the front and rear surfaces of the lead frame remain exposed in this region 70 of the recess 71. Furthermore, the ends 660, 670, 680 and 690 are also not potted, since they are to be used to make contact with the printed circuit board. Consequently, the ends 660-690 extend upwardly (opposite the direction of the recess) out of the injection molded frame and bend here about 90 degrees into the plane of the lead frame to form a support surface 500 for the printed circuit board 10.

The region 70 of the recess is open at the end faces of the lead frame 62. In order to enclose the region 70 of the recess in an annular manner, the injection molded frame 80 is also guided around here as an end wall 82, so that overall a trough-like structure of the injection molded frame results, which can advantageously be molded with further layers serving, e.g., optical functions in a subsequent step.

Figure 7:
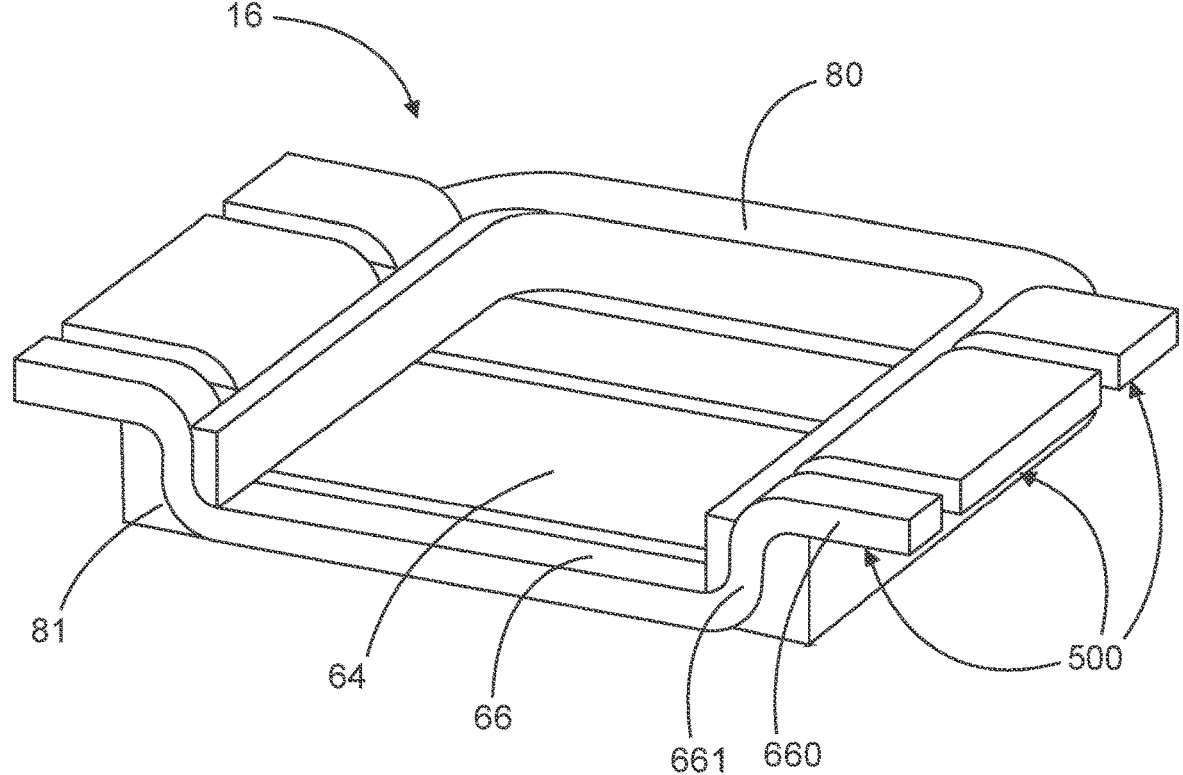
FIG. 7 a perspective view of a lead frame insert punched out according to the process sequence shown in FIG. 4.

In a further process step 140, the lead frame 62 thus processed and provided with injection molded frames 80 is separated from the outer frame 63 and respectively from the inner frame 64 of the blank, so that there is now a lead frame insert 16 insertable into a corresponding printed circuit board 10, as shown in the sectional view of FIG. 7.

Figure 8:
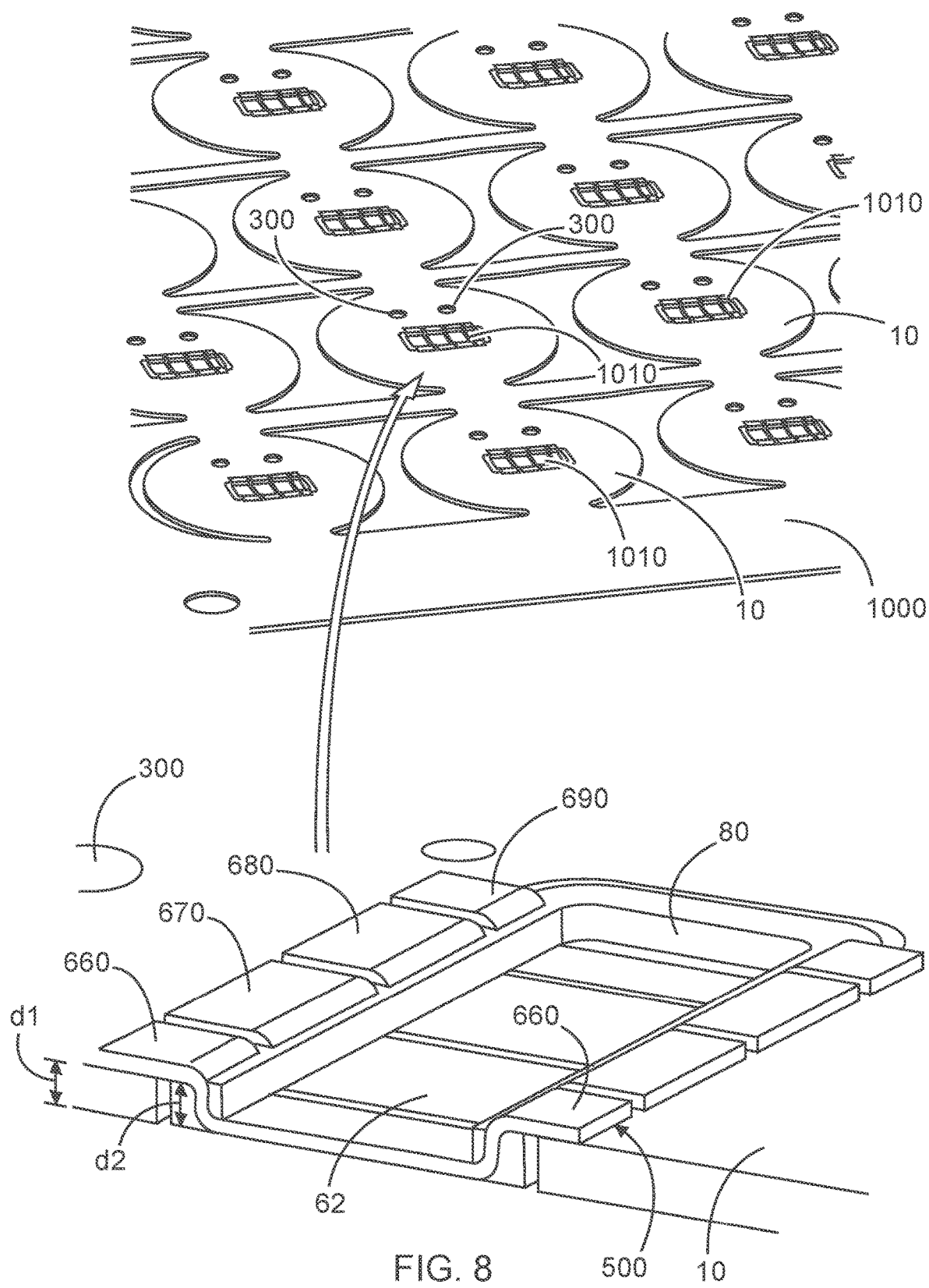
FIG. 8 a perspective view of a lead frame insert inserted into the recess of a printed circuit board according to the process sequence shown in FIG. 4.
Figure 9:
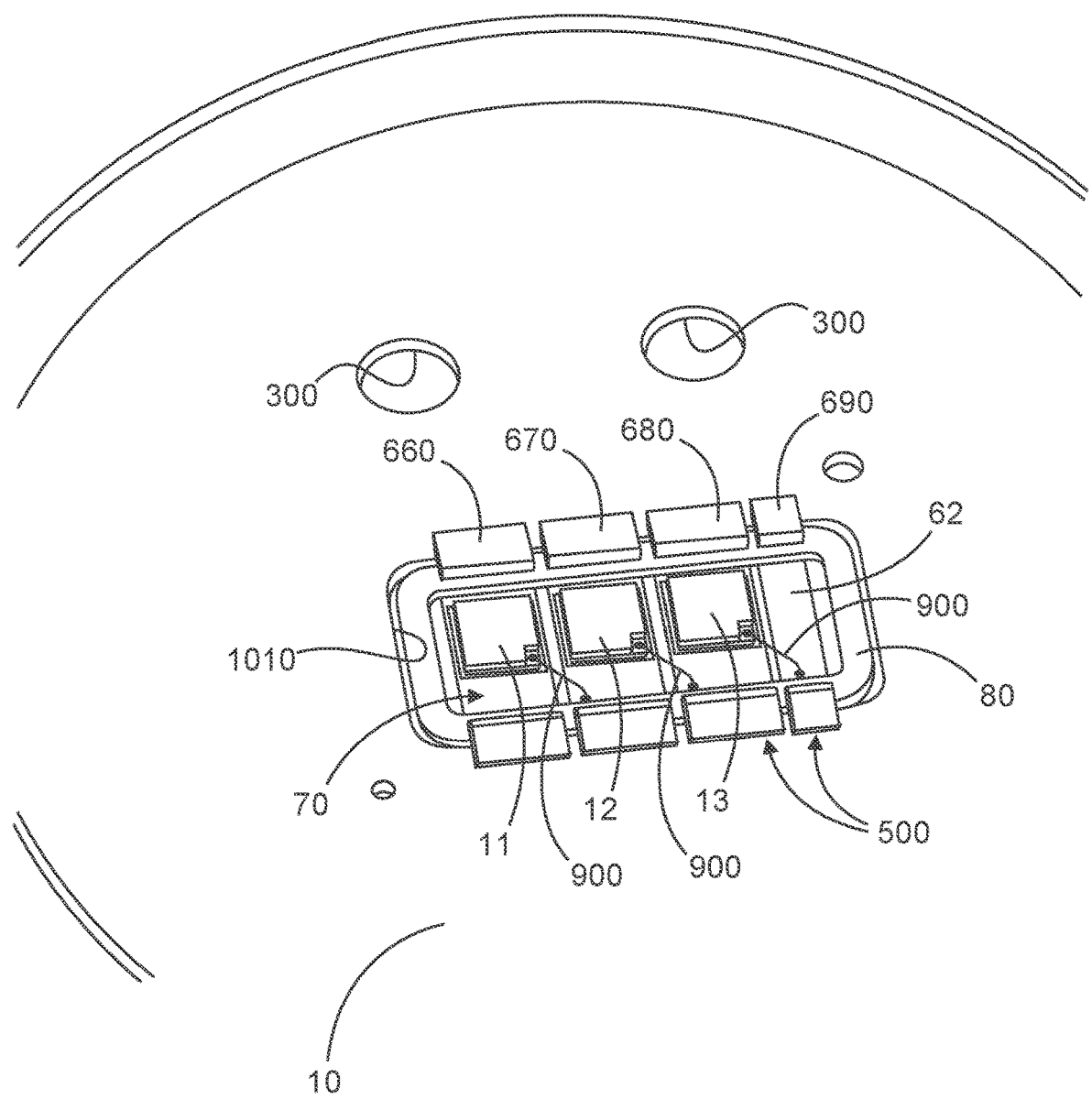
FIG. 9 a perspective view of a lead frame insert with LED chips mounted thereon ("LED chip insert") inserted into the recess of a printed circuit board according to the process sequence shown in FIG. 4.

In process step 200, a printed circuit board blank 1000 is provided, in which—as shown in FIG. 8 above—circular individual printed circuit boards 10 are pre-cut in each case. In these printed circuit boards 10, recesses 1010 are preferably also cut in the same step, the shape of which in the embodiment example is adapted to that of the recessed region 70 of the lead frame insert 16. Furthermore, the apertures 300 for the contact pins 41, 42 as well as individual positioning holes visible in the figures (for alignment during insertion and assembly) may also be cut out.

In this process step 200 of providing the printed circuit board 10 and forming the recess 1010, the conductor lines may also already be formed, preferably from copper, for the wiring of the electronics 8 on the printed circuit board 10 (not shown). Here, too, an anti-oxidation layer may be formed. However, since the wire bonding will later only take place on the lead frame 62 and not on the printed circuit board 10, this layer may, if necessary, also be omitted or be implemented in a less cost-intensive process compared to ENEPIG.

In process step 210, the solder pads for the lead frame insert 62 are now prepared, and in a further process step 220, solder paste is applied to the relevant positions on the printed circuit board 10.

In process step 300, the printed circuit board 10 and the lead frame insert 62 are now brought together. For this purpose, the PCB frame insert 62 is inserted with its recessed region 70 into the recess 1010 of the PCB 10 in the correct orientation so that the contact surfaces 500 or the contact surfaces of the ends 670, 680, 690 of the strings 66-69 come to rest on the solder pads or that of the solder paste applied to them (as far as assigned: not every strand end has to contact or be soldered to a solder pad if, for example, no connection is provided at all). The result can be seen in the bottom of FIG. 8.

In process step 310, reflow soldering is performed at a maximum of 240° C. and for a total of about 5 minutes in the oven, including about 1 minute above 220° C., so that electrical contact is made between the lead frame 62 and the respective lines of the printed circuit board 10.

As can be seen in the bottom of FIG. 8, the PCB 10 and the lead frame insert 16 are now flush on the rear surface because the amount d2 of displacement to form the recess of the lead frame 62 has been made approximately or exactly with the PCB thickness d1 (see FIG. 8). This allows the lead frame 62 to contact the cooling surface 30 of the heat sink 3 facing the direction of emission as shown in FIG. 3 via the thermally conductive adhesive and to dissipate heat very efficiently.

In the next process step 320, the LED chips 11, 12, 13 are die-bonded to the exposed surfaces of the strings 66 to 69 with their base surface forming a first electrical contact, preferably by means of a conductive pressure-sensitive adhesive, in particular a silver conductive adhesive, in the recessed region 70 of the lead frame 62. The process may be carried out at 150° C. for 2 hours, for example.

In the following process step, the LED chips 11, 12, 13 are bonded to a respective adjacent string in the recessed region 70 of the lead frame 62 on the respective top side by wire bonding 900 (in particular gold wire bonding with ball bonder) at a contact point facing the top side, which forms a second electrical contact. As can be seen, the LED chips are thereby connected in series in this embodiment. As mentioned, wire bonding does no longer takes place directly on the printed circuit board, so that no ENEPIG process for anti-oxidation is required on the board itself and may therefore be omitted.

The invention claimed is:

1. A LED chip insert for a printed circuit board comprising:
   a lead frame in which a number of electrically conductive strings with respective ends are formed by punching, the strings having support surfaces which are configured for mounting on the printed circuit board and which form a common plane, wherein the lead frame has a region formed as a recess with respect to the ends;
   an injection molded frame comprising an electrically insulating material and annularly surrounding a surface of the lead frame exposed within the region formed as the recess facing the ends of the strings, and thereby effecting an overall trough-like structure; and
   at least one LED chip which is placed in the region formed as the recess and has a first electrical contact terminal and a second electrical contact terminal, the first electrical contact terminal being electrically conductively connected to a first one of the strings and the second electrical contact terminal being electrically conductively connected to a second one of the strings.

2. The LED chip insert according to claim 1, wherein the region formed as the recess is formed by punching deformation of an originally planar lead frame blank punched out in advance to form the strings.

3. The LED chip insert according to claim 1, wherein the injection molded frame molds a portion of the lead frame adjoining the ends of the strings and extending into the recess, respectively, between and around the strings, thereby effecting a ring-like enclosure.

4. The LED chip insert according to claim 1, wherein the trough-like structure inside the injection molded frame annularly surrounding the recess is filled with a reflective layer, an upper surface of the layer being at the same level as or below an upper light-emitting surface of the LED chip so that the latter is not wetted by the layer.

5. The LED chip insert according to claim 4, wherein the reflective layer comprises titanium oxide.

6. The LED chip insert according to claim 1, wherein the region formed as the recess extends substantially along a plane parallel to the support surface.

7. The LED chip insert according to claim 1, wherein the lead frame is formed of copper, and coated with a protective film against oxidation forming an end surface.

8. The LED chip insert according to claim 1, wherein the injection molded frame at the lead frame is formed from a plastic.

9. The LED chip insert according to claim 8, wherein the plastic is a polyphtalamide (PPA), or a polycyclohexylenedimethylene terephthalate (PCT), or a WEMC (White Epoxy Molding Compound).

10. The LED chip insert according to claim 1,
    wherein the at least one LED chip is placed on a first one of the strings in the region of the recess and is bonded to this first string with its base surface forming the first electrical contact terminal, and
    wherein the at least one LED chip is bonded to a second one of the strings starting from the second electrical contact terminal via a bond wire.

11. A lighting device comprising:
    the printed circuit board formed of an electrically insulating material and having an upper main surface with conductive lines and a bottom main surface opposite thereto, wherein a recess is formed extending through the printed circuit board between the main surfaces; and
    the LED chip insert according to claim 1,
    wherein the lead frame is attached to the printed circuit board,
    wherein the ends of the strings of the lead frame forming the support surface rest on the upper main surface of the printed circuit board and are fixed thereto, and
    wherein the region formed as the recess with respect to the plane is fitted into the recess in the printed circuit board.

12. The lighting device according to claim 11,
    wherein the lead frame has, in the region formed as the recess, a flat rear surface facing away from the ends of the strings,
    wherein the rear surface is substantially flush with the bottom main surface of the printed circuit board, and
    wherein a tolerance of up to 20 µm is permissible with respect to a difference in a direction perpendicular to the bottom main surface.

13. The lighting device according to claim 11, wherein the printed circuit board is formed from a thermally conductive material, and/or wherein the printed circuit board is cut in a substantially circular shape.

14. The lighting device according to claim 11, wherein a plurality of LED chips are provided, wherein a LED chip is placed on a string respectively in the region formed as the recess, and wherein the chip is connected via its contact terminals to a further string on which an adjacent LED chip is placed in the same way so that at least a subset of the LED chips is electrically connected in series with one another.

15. The lighting device according to claim 14, wherein the strings are arranged parallel to each other in the lead frame and the LED chips are arranged in a row along a line or at alternately offset positions on the upper surfaces of the strings, and/or wherein he LED chips are arranged in two mutually parallel rows on the upper surfaces of the strings.

16. A lighting module comprising:
    the lighting device according to claim 11,
    wherein the lighting module is an eXchangeable LED signal lamp (XLS), and/or
    wherein the lighting module has a heat sink with a cooling surface which is contacted by a rear surface of the lead frame directly or via an adhesive.

17. A method for manufacturing a lighting device comprising:
    providing a printed circuit board formed of an electrically insulating material and having an upper main surface with conductive lines and a bottom main surface opposite thereto, wherein a recess is formed extending through the printed circuit board between the main surfaces;
    punching out a lead frame having a number of electrically conductive strings with respective ends;
    punching deformation of the lead frame for forming a plane jointly forming a support surface through the ends of the strings as well as a region formed as a recess with respect to the plane;

fitting the region formed as the recess with respect to the plane into the recess of the printed circuit board and fixing the ends of the strings forming the support surface to the printed circuit board; and placing at least one LED chip on one of the strings in the region formed as the recess and bonding it with its base surface forming a first electrical contact to the string, bonding the at least one LED chip to another of the strings starting from a connection point forming a second electrical contact via a bond wire.

18. The method of claim 17, further comprising forming an injection molded frame of an electrically insulating material on the lead frame such that the injection molded frame annularly surrounds an upper surface of the lead frame exposed within the region formed as the recess to affect a trough-like structure with the at least one LED chip therein.

19. The method of claim 18, further comprising filling the trough-like structure within a ring-like enclosing injection molded frame with the exposed upper surface of the lead frame therein and the at least one LED chip thereon with a reflective layer, wherein the upper surface of the layer is at the same level as or below an upper light emitting surface of the LED chip so that it is not wetted by the layer.

* * * * *